US008600560B2

(12) United States Patent  
Smith et al.

(10) Patent No.: US 8,600,560 B2  
(45) Date of Patent: Dec. 3, 2013

(54) APPARATUS AND METHOD FOR CONTROLLING COMPUTER ROOM AIR CONDITIONING UNITS (CRACS) IN DATA CENTERS

(75) Inventors: Garret Smith, Mathers, CA (US); Raju Pandey, Davis, CA (US); Ray Pfeifer, Los Gatos, CA (US)

(73) Assignee: SynapSense Corporation, Folsom, CA (US)

( * ) Notice: Subject to any disclaimer, the term of this patent is extended or adjusted under 35 U.S.C. 154(b) by 0 days.

(21) Appl. No.: 13/566,428

(22) Filed: Aug. 3, 2012

(65) Prior Publication Data

US 2012/0303164 A1    Nov. 29, 2012

Related U.S. Application Data

(63) Continuation-in-part of application No. 12/317,984, filed on Dec. 30, 2008.

(51) Int. Cl.
| | |
|---|---|
| *G01M 1/38* | (2006.01) |
| *G05B 13/00* | (2006.01) |
| *G05B 15/00* | (2006.01) |
| *G05D 23/00* | (2006.01) |

(52) U.S. Cl.  
USPC ............................ 700/276; 700/277; 700/299

(58) Field of Classification Search  
USPC ......................................... 700/276–277, 299  
See application file for complete search history.

(56) References Cited

U.S. PATENT DOCUMENTS

| | | | |
|---|---|---|---|
| 4,866,606 A | 9/1989 | Kopetz | |
| 5,379,290 A | 1/1995 | Kleijne | |
| 5,408,506 A | 4/1995 | Mincher et al. | |
| 5,515,369 A | 5/1996 | Flammer, III | |
| 5,896,412 A | 4/1999 | Levanon | |
| 6,028,857 A | 2/2000 | Poor | |
| 6,208,247 B1 | 3/2001 | Agre | |

(Continued)

FOREIGN PATENT DOCUMENTS

| | | |
|---|---|---|
| CA | 2616715 | 2/2007 |
| CN | 101401480 | 4/2009 |

(Continued)

OTHER PUBLICATIONS

U.S. Appl. No. 61/033,154; 31 pages; filed Mar. 3, 2008; Federspiel.*

(Continued)

*Primary Examiner* — Ronald Hartman, Jr.  
(74) *Attorney, Agent, or Firm* — Inventive Patent Law P.C.; Jim H. Salter

(57) ABSTRACT

Various embodiments provide an apparatus and method for controlling computer room air conditioning units (CRACs) in data centers. An example embodiment includes: receiving an alert message from a reporting wireless network sensor of a plurality of wireless network sensors via a wireless sensor network, the alert message including information indicative of a modification needed to an environmental condition, the alert message including an indication of stability or instability of a computer room air conditioning unit (CRAC) in a data center; and using the information indicative of a modification needed to an environmental condition at a networked controller to command a device capable of modifying the environmental condition to modify the environmental condition in a manner corresponding to the information in the alert message, commanding the device including controlling fan speed in the CRAC to correct an indication of instability.

20 Claims, 10 Drawing Sheets

(56) References Cited

U.S. PATENT DOCUMENTS

| | | |
|---|---|---|
| 6,304,556 B1 | 10/2001 | Haas |
| 6,404,756 B1 | 6/2002 | Whitehill |
| 6,442,596 B1 | 8/2002 | Dyer |
| 6,480,497 B1 | 11/2002 | Flammer, III |
| 6,590,928 B1 | 7/2003 | Haartsen |
| 6,735,630 B1 | 5/2004 | Gelvin |
| 6,807,165 B2 | 10/2004 | Belcea |
| 6,850,502 B1 | 2/2005 | Kagan |
| 6,856,591 B1 | 2/2005 | Ma et al. |
| 6,859,831 B1 | 2/2005 | Gelvin |
| 7,010,392 B2 | 3/2006 | Bash |
| 7,020,701 B1 | 3/2006 | Gelvin |
| 7,031,329 B2 | 4/2006 | Lipsanen |
| 7,031,870 B2 | 4/2006 | Sharma |
| 7,086,603 B2 | 8/2006 | Bash |
| 7,119,676 B1 | 10/2006 | Silverstrim et al. |
| 7,176,808 B1 | 2/2007 | Broad |
| 7,180,915 B2 | 2/2007 | Beyer |
| 7,272,129 B2 | 9/2007 | Calcev |
| 7,277,414 B2 | 10/2007 | Younis et al. |
| 7,313,461 B2 | 12/2007 | Sharma et al. |
| 7,436,789 B2 | 10/2008 | Caliskan et al. |
| 7,463,644 B2 | 12/2008 | Zhu et al. |
| 7,502,360 B2 | 3/2009 | Liu |
| 7,633,882 B2 | 12/2009 | Das et al. |
| 7,680,092 B2 | 3/2010 | VanLaningham |
| 7,839,764 B2 | 11/2010 | Jiang et al. |
| 8,224,489 B2 * | 7/2012 | Federspiel .............. 700/276 |
| 2002/0073152 A1 | 6/2002 | Andrew |
| 2003/0067745 A1 | 4/2003 | Patel et al. |
| 2003/0067892 A1 | 4/2003 | Beyer |
| 2004/0090329 A1 | 5/2004 | Hitt |
| 2005/0024826 A1 | 2/2005 | Bash |
| 2005/0030968 A1 | 2/2005 | Rich et al. |
| 2005/0074025 A1 | 4/2005 | Shao et al. |
| 2005/0129051 A1 | 6/2005 | Zhu |
| 2005/0157698 A1 | 7/2005 | Park et al. |
| 2005/0173549 A1 | 8/2005 | Bash |
| 2005/0201340 A1 | 9/2005 | Wang |
| 2005/0213612 A1 | 9/2005 | Pister |
| 2005/0237928 A1 | 10/2005 | Le Scolan et al. |
| 2005/0239411 A1 | 10/2005 | Hazra |
| 2006/0029060 A1 | 2/2006 | Pister |
| 2006/0029061 A1 | 2/2006 | Pister |
| 2006/0034191 A1 | 2/2006 | Sahinoglu |
| 2006/0126501 A1 | 6/2006 | Ramaswamy |
| 2006/0149408 A1 | 7/2006 | Speetzer |
| 2006/0161909 A1 | 7/2006 | Pandey |
| 2006/0198346 A1 | 9/2006 | Liu |
| 2006/0206291 A1 * | 9/2006 | Bash et al. .............. 702/194 |
| 2006/0215581 A1 | 9/2006 | Castagnoli |
| 2006/0215583 A1 | 9/2006 | Castagnoli |
| 2006/0225446 A1 | 10/2006 | Bash |
| 2006/0245360 A1 | 11/2006 | Ensor et al. |
| 2006/0268791 A1 | 11/2006 | Cheng |
| 2006/0269028 A1 | 11/2006 | Bley |
| 2007/0050523 A1 | 3/2007 | Emeott |
| 2007/0116060 A1 | 5/2007 | Qu |
| 2007/0143043 A1 | 6/2007 | Wafer et al. |
| 2007/0208992 A1 | 9/2007 | Koren |
| 2007/0211686 A1 | 9/2007 | Belcea |
| 2007/0258508 A1 | 11/2007 | Werb |
| 2008/0008138 A1 | 1/2008 | Pun |
| 2008/0019265 A1 | 1/2008 | Alluisi et al. |
| 2008/0019302 A1 | 1/2008 | Nagarajan et al. |
| 2008/0043707 A1 | 2/2008 | Ren |
| 2008/0084294 A1 | 4/2008 | Zhiying et al. |
| 2008/0095222 A1 | 4/2008 | VanLaningham |
| 2008/0129495 A1 | 6/2008 | Hitt |
| 2008/0151801 A1 | 6/2008 | Mizuta |
| 2008/0253327 A1 | 10/2008 | Kohvakka et al. |
| 2008/0269932 A1 | 10/2008 | Chardon |
| 2008/0298450 A1 | 12/2008 | Zhang |
| 2009/0007706 A1 | 1/2009 | Hitt et al. |
| 2009/0059814 A1 | 3/2009 | Nixon et al. |
| 2009/0109992 A1 | 4/2009 | Lurie et al. |
| 2009/0168796 A1 | 7/2009 | Pandey et al. |
| 2009/0243895 A1 | 10/2009 | Mitchell et al. |
| 2009/0289812 A1 | 11/2009 | Kim et al. |
| 2009/0302996 A1 | 12/2009 | Rhee et al. |
| 2009/0322518 A1 | 12/2009 | Liang et al. |
| 2010/0008286 A1 | 1/2010 | Abedi |
| 2010/0085903 A1 | 4/2010 | Pandey et al. |
| 2010/0148940 A1 | 6/2010 | Gelvin et al. |
| 2010/0177708 A1 | 7/2010 | Pandey et al. |
| 2010/0220653 A1 | 9/2010 | Hwang et al. |
| 2010/0280796 A1 | 11/2010 | Ramin et al. |

FOREIGN PATENT DOCUMENTS

| | | |
|---|---|---|
| DE | 202006019810 | 5/2007 |
| EP | 1719301 | 11/2006 |
| EP | 1911184 | 4/2009 |
| JP | 2004336779 | 11/2004 |
| JP | 2006311549 | 11/2006 |
| JP | 2009504010 | 1/2009 |
| KR | 100646748 | 11/2006 |
| KR | 1020070009390 | 1/2007 |
| KR | 1020070105731 | 10/2007 |
| WO | WO2005083953 | 9/2005 |
| WO | WO2007015962 | 6/2007 |
| WO | WO2008021278 | 7/2008 |
| WO | WO2010077253 A1 | 7/2010 |

OTHER PUBLICATIONS

Kanzaki, Akimitsu et al.; Dynamic TDMA Slot Assignments in Ad Hoc Networks; 17th Int'l Conference on Advanced Information Networking and Applictions; Mar. 2003; pp. 330-335.

Lee, Myung J. et al.; Emerging Standards for Wireless Mesh Technology; IEEE Wireless Communications; Apr. 2006; Vol, 13; pp. 56-63.

Wei Li, et al.; Dynamic TDMA Slot Assignment Protocol for Multihop Ad Hoc Networks; Int'l Conference on Communication Technology; Nov. 2006; pp. 1-4.

C. Frank et al., Proceedings of the $3^{rd}$ International Conference on Embedded Networked Sensor Systems, pp. 230-242, Nov. 2-4, 2005.

PCT International Preliminary Report on Patentability, Jul. 5, 2011.

Sensicast White Paper; 4 pages; Written by Nick Larkin, "Best Practices for Data Center Monitoring Using wireless Sensor Neworks"; 2007; printed from Internet on Oct. 23, 2011.

Public Announcement or Press Release entitled, "Seniscast Announces SensiNet Wireless Sensor Network Support for SNMP"; 3 pages; Nov. 6. 2007; published on www.marketwire.com; printed from Internet on Oct. 23, 2011.

* cited by examiner

US 8,600,560 B2

APPARATUS AND METHOD FOR CONTROLLING COMPUTER ROOM AIR CONDITIONING UNITS (CRACS) IN DATA CENTERS

PRIORITY APPLICATION

This is a continuation-in-part patent application of co-pending patent application Ser. No. 12/317,984; filed Dec. 30, 2008 by the same applicant. This present patent application draws priority from the referenced co-pending patent application. The entire disclosure of the referenced co-pending patent application is considered part of the disclosure of the present application and is hereby incorporated by reference herein in its entirety.

TECHNICAL FIELD

The disclosed subject matter relates to the field of environmental control, and more particularly to environmental control in data centers.

COPYRIGHT

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice applies to the software and data as described below and in the drawings that form a part of this document: Copyright 2011-2012 SynapSense Corporation, All Rights Reserved.

BACKGROUND

A data center can be modeled as rows of racks that house electronic systems, such as computing systems. The computing systems (such as computers, storage devices, networking devices, etc.) consume significant amounts of power for their operation. In addition, these computing systems disperse large amounts of heat during their operation. The computing systems can also affect the humidity, airflow, and other environmental conditions in the data center. In order to ensure proper operation of these systems, the computing systems need to be maintained within tight operating ranges of environmental conditions (e.g., temperature). The computing systems may also need to be maintained within a desired humidity range, a desired air pressure range, and without the presence of moisture or fire. The failure to maintain such environmental conditions results in system failures.

Conventional data centers employ different forms of environmental control devices or cooling mechanisms to keep the computing systems within a safe temperature range. For example, in most data centers, cooling units, such as computer room air conditioning (A/C) or air handling units distribute cold air or cold liquid (such as water and air) to different racks via aisles between the racks. The computing systems of the data center reside in these racks.

There is a significant energy cost associated with maintaining safe environmental conditions in a data center. Cold air and sometimes liquid coolant must be moved through the aisles, racks, and computing systems. In order to optimize this energy usage for controlling environmental conditions, the environmental control devices in the data center must precisely control the volume and temperature of the cooling air or liquid that must be pushed through the sub-plenum and racks of the data center. Unfortunately, many data centers operate by pushing too much cooling air or liquid at very low temperature, thereby incurring significant and unnecessary energy costs. Other data centers must cool an entire room to meet the environmental requirements for a single computing device, thereby wasting energy relative to the other computing devices in the data center.

U.S. Pat. No. 7,031,870 describes a method for evaluating one or more components in a data center, in which inlet and outlet temperatures of one or more heat dissipating devices are detected. In addition, the temperatures of air supplied by one or more computer room air conditioning (CRAC) units are also detected. Indices of air re-circulation for the one or more heat dissipating devices are calculated based upon the detected inlet temperatures, outlet temperatures and supplied air temperatures. The indices of air re-circulation are determined at various flow field settings of air delivered to the one or more heat dissipating devices and the one or more components are evaluated based upon changes in the indices of air re-circulation for the one or more heat dissipating devices at the various flow field settings.

DETAILED DESCRIPTION

Figure 1:
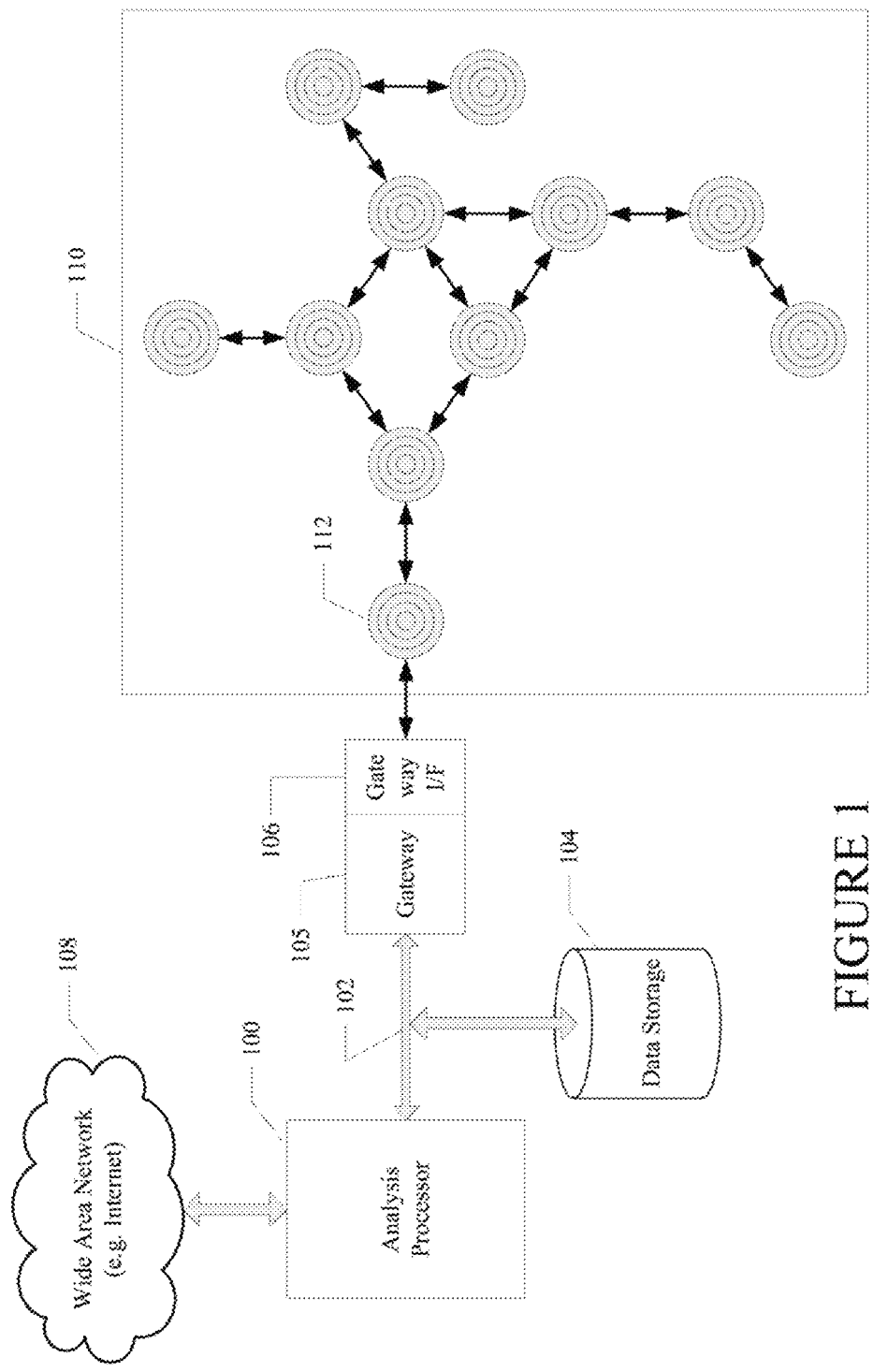
FIG. 1 illustrates a mesh network environment in which various embodiments can operate.

In the following detailed description, reference is made to the accompanying drawings that form a part hereof, and in which are shown, by way of illustration, specific embodiments in which the disclosed subject matter can be practiced. It is understood that other embodiments may be utilized and structural changes may be made without departing from the scope of the disclosed subject matter.

According to various example embodiments of the disclosed subject matter as described herein, there is provided an apparatus and method for controlling Computer Room Air Conditioning Units (CRACs) in data centers. An adaptive method for controlling the volume and temperature of cooling liquid is presented herein. The apparatus and method, in one embodiment, is specifically targeted at CRAC units, which can reduce fan speed and temperature while maintaining the reliability and stability of CRAC operation.

A particular embodiment relates to a network of radio frequency (RF) devices (wireless nodes) that include one or more sensing devices capable of sensing various environmental conditions. Then, using wireless data communications, the wireless nodes can communicate sensor information, environmental information, or network information with other nodes of the network or with a set of network controllers (e.g.

gateways). The network and node configuration in a particular embodiment are described in more detail below.

The various example embodiments of the disclosed system and method include an adaptive method for controlling the volume and temperature of cooling air or liquid used to cool a data center. As described in more detail below, the various embodiments provide several advantages. These advantages include the following:

- The system and method use distributed wireless pressure differential sensors to monitor and characterize the volume of air that is being distributed in a data center.
- The system and method use distributed wireless temperature sensors to characterize the temperature distribution within a data center.
- The system and method use a wireless-based distributed control architecture. In this architecture, an array of control devices manages the operation of cooling units within the data center. Unlike the centralized control scheme in conventional systems, the various embodiments described herein have no single point of failure. Such architecture facilitates distributed decision-making, redundancy and fail-over.
- The system and method use a coordinated control scheme for managing multiple cooling units for optimal cooling.
- The system and method use a local control scheme in which a controller uses local sensing information to control the operation of associated cooling units.
- The system and method define a control scheme that is based on multiple sensing modalities such as temperature and differential pressure.

These and other advantages of the various embodiments described herein will be apparent to those of ordinary skill in the art upon reading this disclosure.

Wireless mesh network technology can be used for deploying sensors as nodes in a variety of different environments for monitoring diverse parameters such as, for example, temperature, pressure, humidity, airflow/fluid flow, the presence of moisture, the presence of smoke or tire, and the like. These types of networks can be denoted wireless sensor networks (WSN). Each sensor in a WSN is typically powered by a battery and therefore capable of operating in a wireless configuration. As described in more detail below, the sensors can constantly monitor the environment for various environmental conditions and may communicate with other nodes and/or a network controller or gateway.

FIG. 1 illustrates a network environment of an example embodiment including a mesh network 110 of wireless sensors 112. Each of the sensors can be implemented as the combination of components illustrated in FIG. 2 and described in more detail below. Wireless sensor network (WSN) 110 includes a set of wireless sensors 112 (nodes), each in data communication with others of its proximate neighbor nodes. The nodes 112 can communicate using established data communication protocols, typically at the Media Access Control (MAC) Layer. The MAC Layer is one of two sub-layers that make up the Data Link Layer of the well-known OSI networking model. The MAC layer is responsible for moving data packets to and from the network interface of one node to another node across a shared channel. A node can be any vertex or intersection in the communication network 110. A node may be passive or intelligent. In a particular embodiment, a node is assumed to be an intelligent node capable of receiving and analyzing information, taking certain actions as a result of received information, including the storing of received or processed information, modifying at least part of received information, and in some instances originating and retransmitting information. The details of a node of a particular embodiment are detailed in FIG. 2.

Referring still to FIG. 1, data packets or messages can be directed between any two nodes of the WSN 110 as each node 112 has a unique identifier. A data packet or message is a self-contained unit of transmitted information. Typically, a data packet has a header, a payload, and an optional trailer. A link is a path which originates at one node and terminates at one other node. A link or path between nodes may include multiple hops between a plurality of intermediate nodes prior to reaching a destination node. The transfer of messages between two nodes of WSN 110 in a unicast or broadcast transmission is termed a local communication.

Each of the nodes 112 of WSN 110 can also communicate with a gateway 105 via a gateway interface 106. The gateway 105 provides a connection between the WSN 110 and an analysis processor 100. Analysis processor 100 can be used to receive sensor data from any of the nodes 112 of WSN 110 via gateway 105 and to analyze the sensor data for aggregated environmental monitoring and control. Gateway 105 and analysis processor 100 can use a conventional data storage device 104 for data storage and retrieval. Analysis processor 100 can also include a connection to a wide area network 108, such as the Internet. In this manner, the gateway 105 and the WSN 110 can obtain access to the Internet.

The WSN 110 can be configured in any of a variety of ways. Nodes 112 can be added, removed, or moved within the array of nodes of WSN 110. Each of the nodes 112 include functionality to join or reconfigure themselves in the WSN 110 when a node is added or moved. As part of this functionality, each node 112 can discover its neighbor nodes and automatically negotiate and establish communication paths with those neighbors. A node can be in direct data communication with neighbors that are within the radio reception range of the node. Depending on the strength of the wireless transceivers (e.g., radios) within each node 112, the distance between neighbor nodes is variable. Given that in some applications the environment in which WSN 110 is being used may be subject to radio interference, it is possible that the wireless data communications between nodes may be disrupted. In these cases, each node can sense the loss of data communications with a neighbor and may reconfigure itself to use alternate data paths through other functioning nodes of WSN 110. As such, the WSN 110 is highly adaptable to changing conditions in the environment and in the configuration of the wireless network.

Figure 2:
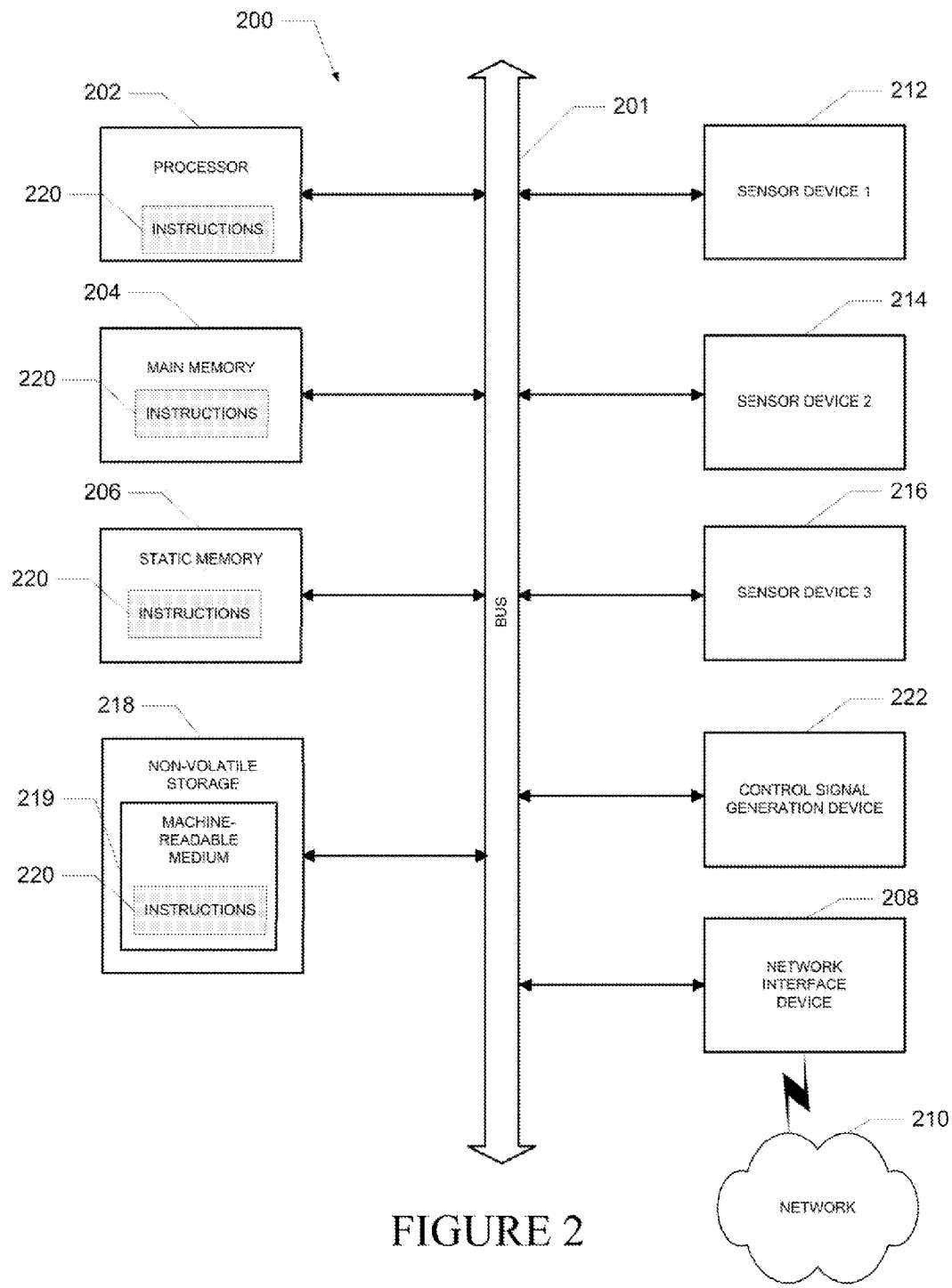
FIG. 2 illustrates an example embodiment of a node that can operate in a mesh network.

FIG. 2 shows a diagrammatic representation of a machine in the example form of a network node or sensor unit 200 within which a set of instructions, for causing the node to perform any one or more of the methodologies discussed herein, may be executed. In alternative embodiments, the node operates as a standalone device or may be connected (e.g., networked) to other machines. In a networked deployment, the node may operate in the capacity of a server or a client machine in client-server network environment, or as a peer machine in a peer-to-peer (or distributed) network environment, such as a mesh network. The node may be a computer, an intelligent sensor, a logic device, an application specific integrated circuit (ASIC), a field programmable gate array (FPGA), a hard-wired module, a network router, gateway, switch or bridge, or any machine capable of executing a set of instructions (sequential or otherwise) that specify actions to be taken by that machine. Further, while a single machine is illustrated in FIG. 2, the term "machine" or "node" shall also be taken to include any collection of machines that individually or jointly execute a set (or multiple sets) of instructions to perform any one or more of the methodologies discussed herein.

The example node 200 includes a processor 202 (e.g., a central processing unit (CPU)), a main memory 204 and optionally a static memory 206, which communicate with each other via a bus 201. The node 200 may further include one or more sensor devices 212, 214, and 216. These sensor devices can include temperature sensors, humidity sensors, air pressure sensors, air flow sensors, moisture detectors, carbon monoxide detectors, smoke detectors, motion detectors, seismic detectors, and/or other types of sensors for detecting and measuring a desired environmental condition.

The node 200 may further include a non-volatile memory 218, a control signal generation device 222, and a network interface device 208 (e.g., a radio transceiver or wireless device capable of connection with a network). The non-volatile memory 218 includes a machine-readable medium 219 in which is stored one or more sets of instructions (e.g., software and data 220) embodying any one or more of the methodologies or functions described herein. The instructions 220 may also reside, completely or partially, within the main memory 204, the static memory 206, and/or within the processor 202 during execution thereof by the node 200. The main memory 204, static memory 206, and the processor 202 also may constitute machine-readable media. The software, instructions, and/or related data 220 may further be transmitted or received over a network 210 via the network interface device 208. The network interface device 208, in a wireless node configuration of one embodiment, may include a radio transceiver for sending and receiving data to/from network 210 using a wireless data transfer protocol, such as the family of 802.11 standards from IEEE. In this manner, node 200 can perform wireless data communications with other nodes of WSN 110. The control signal generation device 222 can be used to control the operation of an environmental management system, such as a heating/ventilating/air conditioning (HVAC) system, a fan, a heat pump, or other device or system that can alter the environmental conditions being monitored by sensors 212, 214, and 216.

Typically in wireless network systems, the wireless data transceivers (e.g., radios) in the network nodes consume the most electrical power and represent the largest drain on the node's battery power. As such, the radio should be turned off for most of the time to increase the battery lifetime of the nodes. In an example embodiment, all nodes of WSN 110 are time synchronized. Each node wakes up for a short period of time for radio communication with other nodes or the gateway. Then, the node's radio is shut off and the node sleeps until the next communication cycle.

Figure 3:
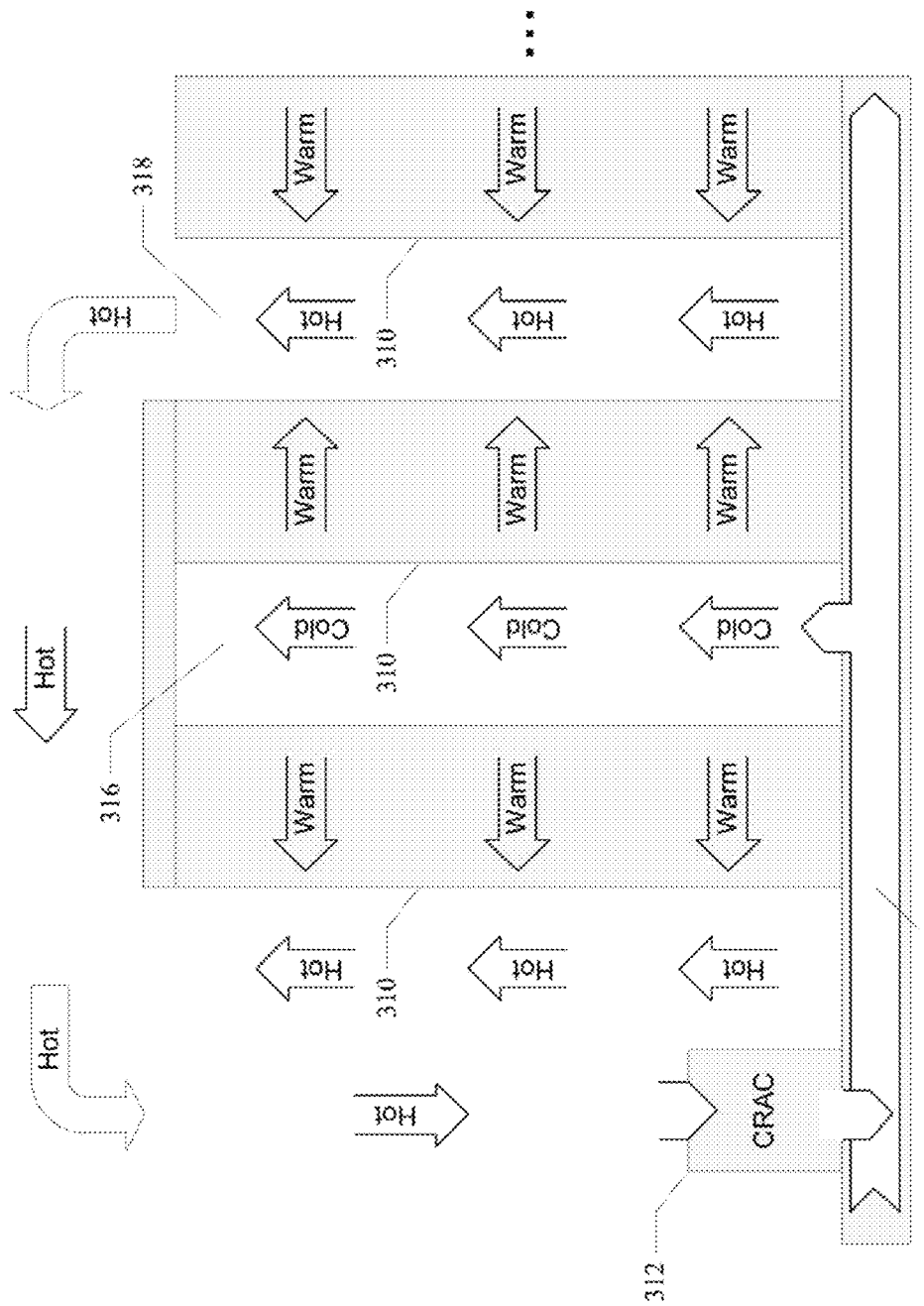
FIG. 3 illustrates an example of a prior art process for cooling racks in a data center.

FIG. 3 illustrates the organization of a conventional data center and the standard process for controlling the temperature in the center. As shown, the well-known data center configuration includes a set of racks 310 that support stacked sets of electronic equipment. Because the operating electronic equipment generates heat, it is necessary to cool this equipment with a computer room air conditioning (CRAC) unit 312 (also denoted herein as a computer room air handler—CRAH). The CRAC 312 generates cold air that is pumped through a space 314 under a raised floor into different aisles (e.g., aisle 316) between racks 310. The aisles (e.g., aisles 316 and 318) are organized into cold and hot aisles. Aisle 316 is a cold aisle. Aisle 318 is a hot aisle. In the cold aisles (e.g., aisle 316), the input side of the air inlets of the electronic equipment in racks 310 face the cold aisle (e.g., aisle 316). The cool air is pumped into the cold aisle 316. The cool air then moves through the air inlets of the electronic equipment in racks 310 keeping these systems cool. As the air moves through the racks 310, the air gains heat from the electronic equipment. The heated air exits the racks 310 and moves into the hot aisles (e.g., aisle 318). The heated air rises out of the hot aisles and eventually returns to the input side of the CRAC 312 where the heated air can be cooled and again cycled through racks 310.

Although the conventional data center air conditioning system illustrated in FIG. 3 and described above can control the temperature in a data center, the conventional system is not energy efficient. Further, the conventional system cannot distinguish between the cooling requirements for the different electronic devices in racks 310. For example, it is possible that some electronic systems in racks 310 may run hotter than other systems. Some systems may require a greater or lesser air flow rate. The conventional system is not sensitive to the individual environmental needs of each of the electronic devices in racks 310.

As described herein, an apparatus and method for controlling computer room air conditioning units (CRACs) in data centers is disclosed. The apparatus and method in a particular embodiment include using a network of wireless sensors to monitor various environmental conditions in specific locations in a data center over time, predict the thermal and pressure trending of the specific locations at a future point in time, and generate control signals to drive particular environmental conditions towards a desired state. The adaptive environmental control method and apparatus described and claimed herein enable more efficient control of environmental conditions in a data center and thereby enable significant savings in energy consumption.

Figure 4:
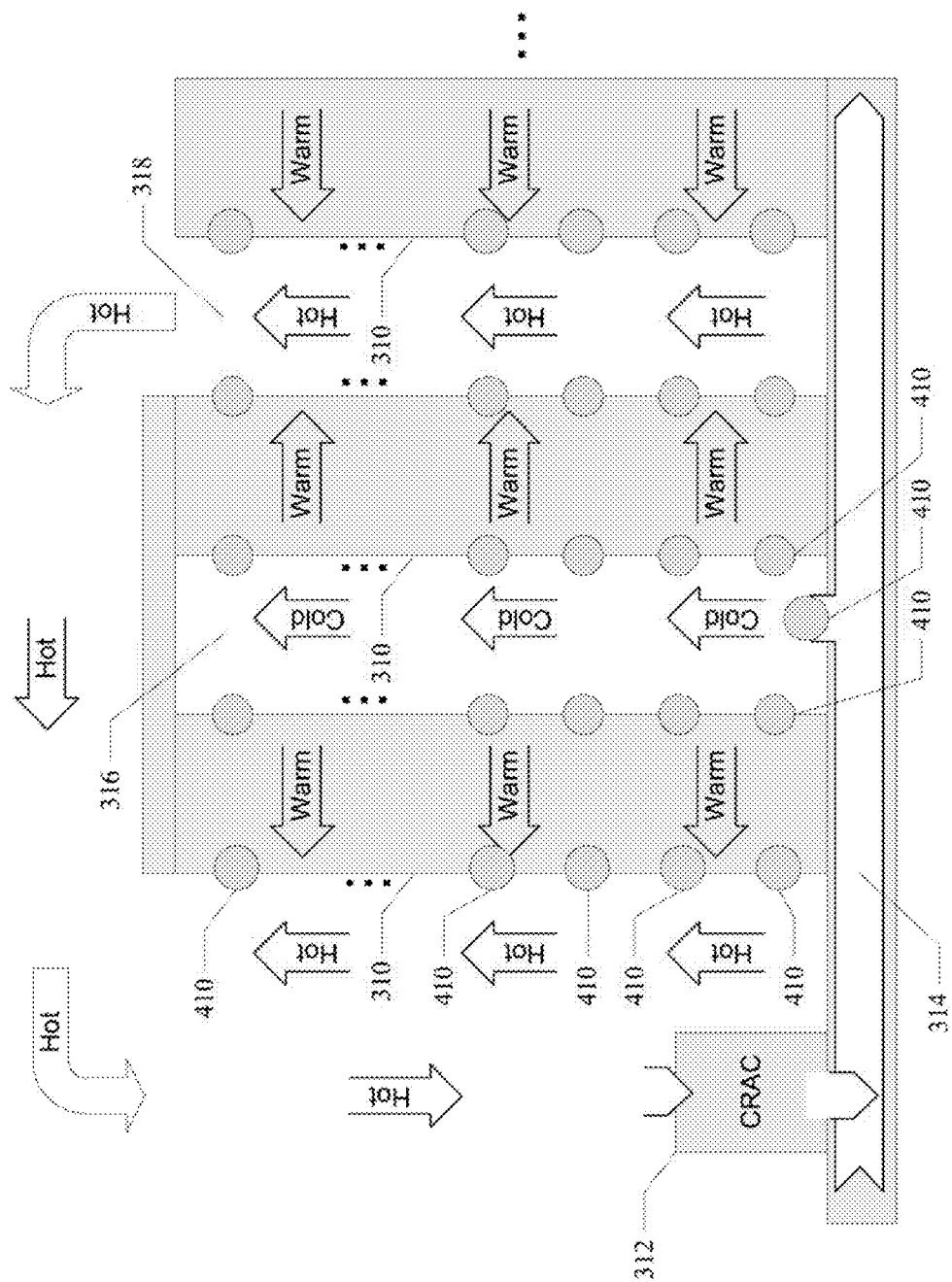
FIG. 4 illustrates a data center configuration of a particular embodiment that includes a set of racks that support stacked sets of electronic equipment.

FIG. 4 illustrates a data center configuration of a particular embodiment that includes a set of racks 310 that support stacked sets of electronic equipment. In the illustrated example, wireless sensor devices 410 have been installed at various points on each side of each of racks 310. The wireless sensor devices 410 can be implemented as the devices illustrated in FIG. 2 and described above. As described above in connection with FIGS. 1 and 2, the wireless sensor devices 410 are wirelessly networked together in a network 110 (shown in FIG. 1) and in data communications with a gateway 105 and an analysis processor 100. Each of the sensors 410 can be configured to sense various environmental conditions, such as temperature. At a predetermined and configurable time interval, sensors 410 can measure the temperature and other environmental conditions at each sensor location and retain the environmental data measurements along with a timestamp associated with each environmental data measurement. Using the data network 110, the sensors 410 can transmit time-stamped environmental data along with a sensor identifier to the analysis processor 100 for processing. In this manner, the analysis processor 100 can collect the time-stamped environmental data from each of the sensors 410 installed in racks 310. It will be understood by those of ordinary skill in the art upon reading this patent disclosure that an arbitrary number of sensors 410 can be installed in the racks 310 in arbitrary positions within each rack of a particular data center. In general, the greater number of sensors 410 increases the ability for the system to detect more subtle changes in the environmental conditions within the data center as will be described in more detail below.

Figure 5:
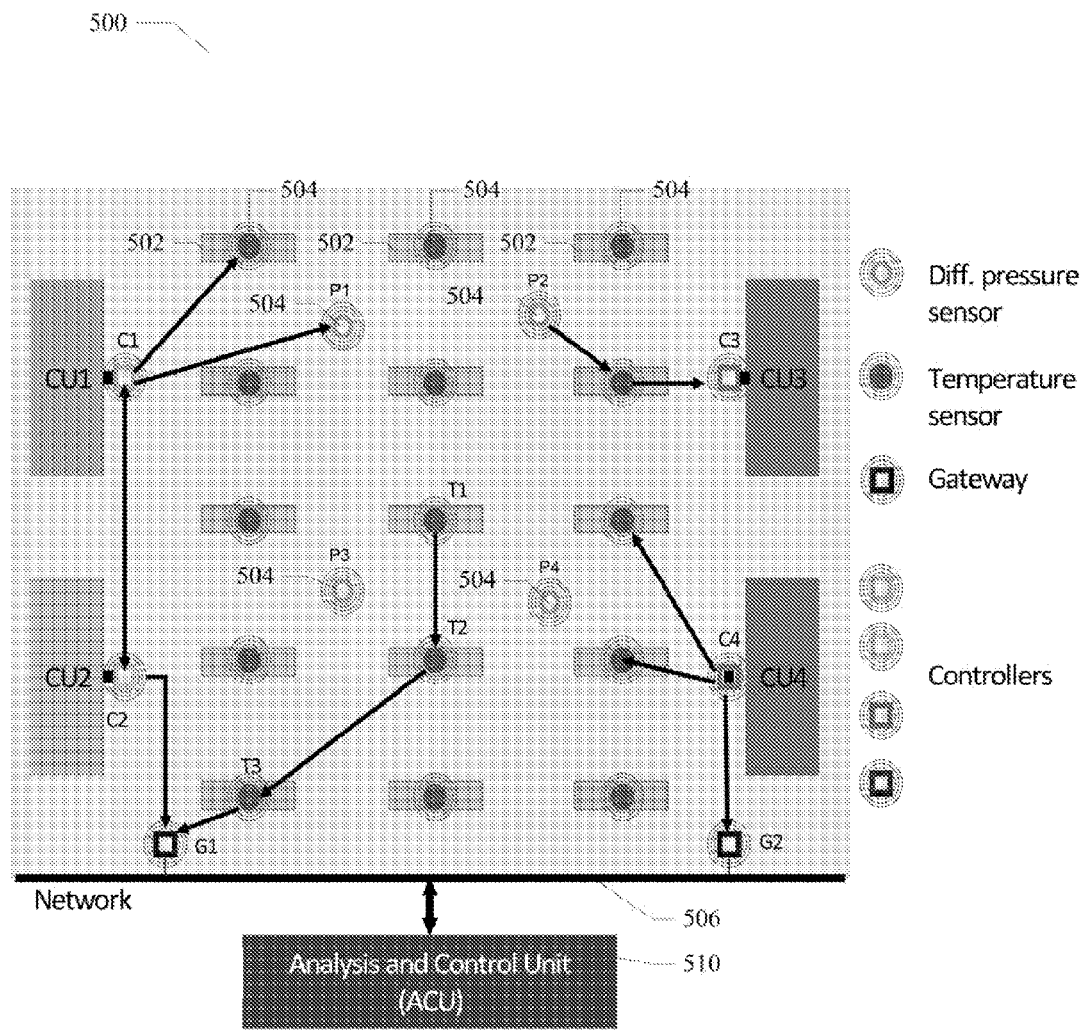
FIG. 5 illustrates an example deployment of a particular embodiment in a data center.

FIG. 5 illustrates an example deployment of a particular embodiment in a data center. As will be described in more detail below, the typical deployment includes an array of networked devices in a distributed network architecture. In a particular example embodiment, the adaptive system described herein can include several kinds of devices, including wireless sensors, gateways and routers, and controllers that are distributed in the data center. FIG. 5 illustrates such an example system 500.

Figure 6:
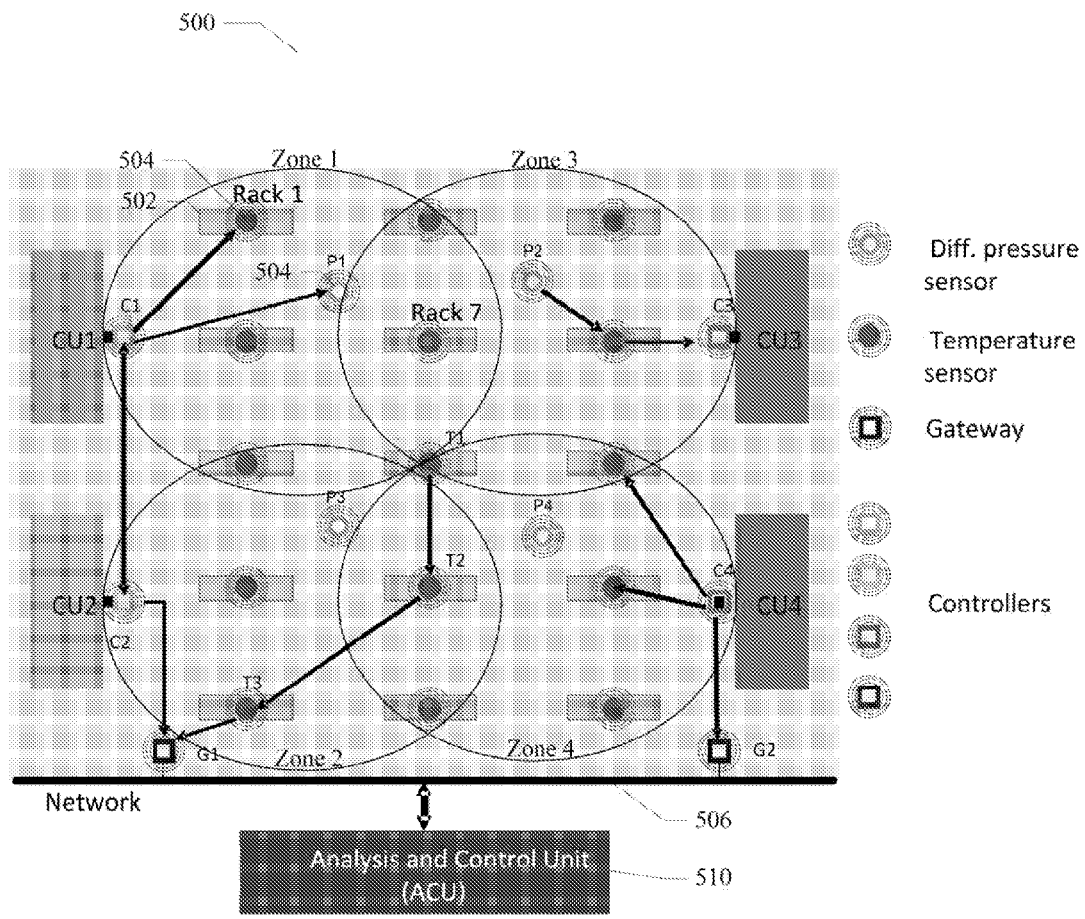
FIG. 6 illustrates the influence zones associated with the different racks as determined at the influence zone calibration phase.

The characteristics of the different devices distributed in system 500 are described below and illustrated in FIGS. 5 and 6. A particular data center can include a plurality of racks 502 in which electronic components needing environmental control are positioned. There can be n environmental sensors 504 (e.g., temperature sensors) associated with a rack 502 (i: $S_i^1$, $S_i^2$, ..., $S_i^n$). ASHRAE (American Society of Heating, Refrigerating and Air Conditioning Engineers) recommends n to be 3; in actual deployments, n may vary depending on the desired granularity of sensing. In some deployments, n sensors may also be placed on the hot side of a rack 502. In some deployments, all racks 502 may have temperature sensors 504; in other deployments, only the alternate racks or every third rack may have these sensors 504. Racks 502 that have temperature sensors 504 will typically have a humidity sensor at the top of the rack as well. As shown in FIG. 5, sensors T1 and T2 are examples of rack sensors 504 that monitor temperature and humidity at the racks 502. Each of the sensors 504 can be wireless network sensors connectable in a wireless sensor network as described above.

In the embodiment shown in FIG. 5, the example data center includes four cooling units (CU1, CU2, CU3, and CU4). Each cooling unit can have two sensors associated with the cooling unit: one sensor at the supply side of the cooling unit monitors the supply temperature and humidity being output by the cooling unit; another sensor at the return side of the cooling unit monitors the return temperature and humidity being input to the cooling unit. As shown in FIG. 5, sensor C1, for example, provides the supply and return temperature, and humidity at the cooling unit CU1. In a particular embodiment, a Resistance Temperature Detector (RTD) can be placed near an expansion bulb of a Thermostatic Expansion Valve (TXV) of cooling unit CU1. This allows the Analysis and Control Unit (ACU), described in more detail below, to measure and respond to the same temperature to which the TXV responds. The RTD can be placed in contact with or proximate to the evaporator of cooling unit CU1 and insulated to achieve the most accurate readings possible from outside the refrigeration coil of cooling unit CU1. The RTD can be connected with or integral to a wireless sensor device, such as sensor C1, as described above, that can transmit the sensed temperature value at the TXV to the gateway 105 and then to the Analysis and Control Unit (ACU) of analysis processor 100.

Other sensors, C2. C3, and C4 and related RTDs can be similarly configured to perform similar functions for cooling units CU2, CU3, and CU4, respectively. As will be described in more detail below, sensors C1, C2, C3, and C4 can be combined with a controller function to control the operation of the corresponding cooling unit. Further, each of the sensors C1, C2, C3, and C4 can be wireless network sensors connectable in a wireless sensor network as described above.

For raised floor type supply air delivery as is common in conventional data centers, pressure sensors can be deployed below the raised floor to measure the differential pressure between the sub-floor plenum and room pressure. Pressure sensors can be placed under the raised floor and attached to the underside of tiles at ends of cold aisles, in hot aisles, and in cold aisles where solid vs. perforated tiles are available. For overhead supply air delivery, pressure sensors can be deployed to measure the differential pressure between the supply air duct and the room as measured in the cold aisles. In the embodiment shown in FIG. 5, the example data center includes four differential pressure sensors, P1, P2, P3, and P4.

Each of the pressure sensors, P1, P2, P3, and P4 can be wireless network sensors connectable in a wireless sensor network as described above.

Each cooling unit (CU1, CU2, CU3, and CU4) is controlled by two internal controllers: a Unit controller and a Variable Frequency Drive (VFD) controller. The unit controller usually comes with the cooling unit and is used. (a) to change the supply temperature of the cooling air/liquid that the cooling unit is supplying (outputting), and (b) to access the status of the cooling unit via the WSN. Each cooling unit may have several VFD units that control the fans on the cooling units. Each VFD unit has a VFD controller that is used to change the fan speed.

In the embodiment shown in FIG. 5, the example system 500 includes a wireless controller device (WCD) associated with each cooling unit. A wireless controller device is similar to a wireless sensor device (described above) in that the WCD can process data, store local information, and use the wireless radio to transmit information on the WSN. In a particular embodiment, the WCD functionality can be combined with the sensor functionality of sensors C1, C2, C3, and C4. The WCD also includes additional hardware infrastructure to connect with the controllers (e.g., the unit controller and VFD controllers) on the cooling units. The WCD hardware infrastructure, for example, can communicate with the cooling unit's controllers through one of the standard protocols (such as, ModBus, BacNet, SNMP and LonTalk) or through a 4-20 ma direct connection. The WCD controls the operation of a cooling unit by, (a) modifying the set points for the supply temperature and humidity on an internal CRAC controller, and (b) by changing the cooling unit's fan speed through the VFD controller. In the particular embodiment shown in FIG. 5, the system 500 includes four WCD's (C1, C2, C3, and C4) as combined with cooling unit sensors described above. Each of the sensor/controllers C1, C2, C3, and C4 can be wireless network sensor/controllers connectable in a wireless sensor network as described above.

Gateways connect the wireless sensors 504 and sensor/controllers C1, C2, C3, and C4 to an IP network, such as the Internet. In the embodiment shown in FIG. 5, the example data center includes two gateways, G1 and G2, connected to a data network 506. The sensors 504 and sensor/controllers C1, C2, C3, and C4 connect to the IP-based network through G1 and G2.

In the embodiment shown in FIG. 5, the example system 500 includes a centralized software system, called Analysis and Control Unit (ACU) 510, which stores all of the sensing, control, and status information that is forwarded to the gateways G1 and G2 by the wireless sensors 504 and sensor/controllers C1, C2, C3, and C4. The ACU 510 is primarily a repository of information and system-wide data processing for system 500. In one embodiment, the Analysis and Control Unit (ACU) can be integral to or connectable with the analysis processor 100 shown in FIG. 1.

In the example embodiment shown in FIG. 5, the wireless sensors 504, sensor/controllers C1, C2, C3, and C4, and gateways G1 and G2 (denoted generally herein as the network devices) cooperate to build a mesh data communications network that provides connectivity among the network devices. In a particular embodiment, several sets of communication paths, described below, are created among the different network devices of system 500. Each sensing or control network device (i.e., the wireless sensors 504 and sensor/controllers C1, C2, C3, and C4) has multi-hop communication paths to the set of gateways. G1 and G2. Each sensing or control network device can periodically send sensor and/or control information, device status, cooling unit status, etc. to the gateways G1 and G2. The sensor and/or control information is then aggregated at the ACU 510. For example, as shown in FIG. 5, network sensing device T1 can send sensor information, gathered by sensor T1, to gateway G1 by routing the sensor information through network sensing devices T2 and T3.

Gateways have communication paths to all sensing and control devices in a particular system. Gateways can send commands, status information, or data center relevant information to the network devices. For example, in the example embodiment shown in FIG. 5, Gateway G2 can request that controller C2, sensors T1, T2 and T3, and other gateways provide their current status.

Each sensing device 504 has communication paths to a fixed number of controllers (e.g., controllers C1, C2, C3, and C4). Each sensing device 504 can use the communication paths of the wireless sensor network to distribute sensor data (such as temperature, pressure and humidity) to particular controllers or gateways in the wireless sensor network on a periodic basis.

Controllers (e.g., controllers C1, C2, C3, and C4) have communication paths to some of the network sensing devices 504. The controllers can send status information or request the sensing devices 504 to provide latest sensor data.

Controllers also have communication paths to other controllers. The controllers (e.g., controllers C1, C2, C3, and C4) can communicate with each other in order to cooperatively control several cooling units. For example, controllers C1 and C2 can communicate with each other to ensure that the fan speeds on the cooling units CU1 and CU2 provide the appropriate amount of cooling air/liquid to the racks influenced by cooling units CU1 and CU2.

The entire environmental adaptation system 500 can operate by deploying the different wireless sensing and control devices in a data center as described above. Once the system of network devices has been deployed, the system 500 can operate by going through several phases. These phases include. 1) the system initialization phase, 2) the influence zone calibration phase, 3) the normal operation phase, and 4) the system adaptation phase. These system phases of a particular embodiment are described in detail below.

The networked wireless sensing devices 504, routers, controllers (e.g., controllers C1, C2, C3, and C4) and gateways (e.g., G1 and G2) of a particular environmental adaptation system can communicate with each other during an initialization phase. In this phase, a multi-hop mesh networking infrastructure can be built that allows network devices to communicate information with each other.

During the influence zone calibration phase, controllers (e.g., controllers C1, C2, C3, and C4) and sensing devices 504 go through a calibration process to learn how specific cooling units (e.g., CU1, CU2, CU3, and CU4) influence specific parts or zones of the data center. FIG. 6 illustrates an example data center with cooling units, racks, and network devices. FIG. 6 also illustrates the influence zones associated with the different cooling units. The influence zone of a cooling unit includes all racks whose thermal conditions are affected by the temperature and the volume of the cooling liquid that the cooling unit supplies. As shown in the example of FIG. 6, the environmental conditions in rack 1 are influenced by CU1, whereas the environmental conditions in rack 7 are influenced by both CU1 and CU3. The calibration process that identifies the influence zones for every cooling unit can be done either manually or automatically. The calibration process results in influence zone tables that include information associating particular cooling units (e.g., CU1, CU2, CU3, and CU4), controllers, and networked sensing devices 504 with the specific zones of the data center. The influence zone tables can be used during the system adaptation phase as described below. The influence zone tables can be stored at each networked sensing device 504, the control nodes, and/or stored centrally at the controllers or the ACU 510.

During the normal operation, the networked sensing devices 504 monitor the environmental conditions periodically, and send the environmental status information to one of the gateways (e.g., G1 or G2) and associated controllers (e.g., controllers C1, C2, C3, and C4). In a steady state, the environmental conditions are within prescribed limits, and no adaptations are needed. However, if the environmental conditions are outside of prescribed limits, a system adaptation phase of system 500 is entered as described below.

As the environmental conditions of a particular data center change during normal operation—possibly due to the increased or decreased load or due to the loss of one or more cooling units—both the volume and the temperature of the cooling air/liquid need to be changed in order to meet the new operational needs and to bring the environmental conditions of the data center within prescribed limits. The system adaptation will typically involve changing the temperature set points and/or changing the fan speed on the different cooling units (e.g., CU1, CU2, CU3, or CU4). The distributed adaptation system of a particular embodiment as described herein provides the infrastructure to, (a) identify the environmental conditions that have changed, (b) identify the cooling units that are affected, (c) notify the relevant cooling unit controllers of the required changes, (d) effect the changes required, and (e) use the deployed networked sensors 504 as a feedback mechanism to ensure that changes at the cooling units have resulted in safe, effective, and efficient operation. Further details of the distributed adaptation system of a particular embodiment are provided below.

The wireless temperature sensors 504 of an example embodiment maintain two configurable threshold values: maximum (Tmax) and minimum (Tmin). A temperature higher than Tmax (i.e., outside of prescribed limits) highlights unsafe operating conditions for electronic systems stored in racks 502 near the networked sensing device 504. A temperature lower than Tmin (i.e., outside of prescribed limits) indicates overcooling, resulting in energy inefficiency. One goal of the distributed adaptation system of a particular embodiment is to maintain the temperature at the inlets of the racks 502 between Tmin and Tmax (i.e., within prescribed limits).

In a particular embodiment, temperature adaptation in system 500 takes place in the following manner. First, each networked sensing device 504 reads the temperature (T) periodically at its location. If the measured temperature is between Tmin and Tmax as previously configured, the networked sensing device 504 can send this measured temperature information or current status to the nearest gateway (i.e. G1 or G2). The gateway can transfer this information to ACU 510 via network 506. The ACU 510 may store this information for later processing according to a pre-determined processing interval or the ACU 510 may process the information from networked sensing devices 504 on receipt. However, if temperature (T) as measured by a particular networked sensing device 506 is outside the pre-configured [Tmin, Tmax] range, the particular networked sensing device 504 enters an adaptation mode. In the adaptation mode, the networked sensing device 504 can sense the environmental conditions more often to record any changes. Additionally, the networked sensing device 504 can access its influence zone table and identify the cooling units (e.g., CU1, CU2, CU3, or CU4) and associated controllers (e.g., C1, C2, C3, and C4) that are associated with (i.e., that can influence the environmental conditions of the locations proximate to) the particular networked sensing device 504. Once the networked sensing device 504 has identified the associated controller(s) that can influence the relevant locations, the networked sensing device 504 can send a message to the associated controllers (e.g., C1, C2, C3, and C4) and the nearest gateway (e.g., G1 or G2). The message sent by the networked sensing device 504 can include information requesting the associated controller(s) to issue commands to its associated cooling unit to cause the cooling unit to seek a desired environmental condition. For example, if the networked sensing device 504 has determined that the temperature (T) as measured by the particular networked sensing device 506 is higher than Tmax, the networked sensing device 504 can request the associated controller(s) to issue commands to its associated cooling unit to cause the cooling unit to lower its supply temperature or increase its fan speed or both. If the networked sensing device 504 has determined that the temperature (T) as measured by the particular networked sensing device 506 is lower than Tmin, the networked sensing device 504 can request the associated controller(s) to issue commands to its associated cooling unit to cause the cooling unit to increase its supply temperature or decrease its fan speed or both. Similarly, if the networked sensing device 504 has determined that the pressure or humidity as measured by the particular networked sensing device 506 is outside of prescribed limits, the networked sensing device 504 can request the associated controller(s) to issue commands to its associated cooling unit to cause the cooling unit to effect a change in the relevant environmental condition.

In the adaptation mode, the networked sensing device 506 can be configured to sense and measure the various environmental conditions more often to record any changes as the system 500 seeks a desired environmental condition. As changes to the environmental conditions occur, the networked sensing device 506 can send information identifying the changes to the environmental conditions back to the networked controller as a feedback. In this manner, the networked sensing device 506 can assist the networked controller to determine the rate at which the environmental conditions are changing. If the environmental conditions are not changing fast enough (or changing too fast), the controller can react and command the cooling unit(s) accordingly.

In a particular embodiment, the behavior of a networked temperature sensing device can be described in detail below.

```
Configure the following parameters for the device:
    L = Location of device
    Id = Identifier of the device
    Tmin = Lower bound on temperature at location L
    Tmax = Upper bound on temperature at location L
    sn = elapsed time between sensing during normal mode
    sh = elapsed time between sensing during overheated mode
    mh = maximum time to wait for temperature to become < Tmax
    sl = elapsed time between sensing during overcooled mode
    ml = maximum time to wait for temperature to become > Tmin
    CC = centralized controller
mode = normal
forever do
    T = sense current temperature;
    if T > Tmax then // rack is overheated
        mode = overheated
        Send <T, Tmax, id> to CC;
        repeat
            Sleep for sh seconds;
            T = sense current temperature;
            if T < Tmax
                mode = normal
                Send acknowledgement CC;
            else if wait time > mh
                Send request to CC again;
                Send an alarm condition to CC;
            end if
        until (mode == normal)
    else if T < Tmin then // rack is overcooled
        mode = overcooled
        Send <T, Tmin, id> to CC;
        repeat
            Sleep for sl seconds;
            T = sense current temperature;
            if T > Tmin
                mode = normal
                Send acknowledgement to CC;
            else if wait time > ml
                send request to CC again;
                send an alarm condition to CC;
            end if
        until (mode == normal)
    end if
    sleep for sn seconds;
end
```

A networked controller device (e.g., C1, C2, C3, and C4) manages, among other environmental conditions, the supply temperature of the cooling air/liquid provided by the cooling unit the networked controller device controls. The networked controller constantly (e.g., at pre-configured periodic intervals) monitors the status of the cooling unit the networked controller device controls. The networked controller can pass the status and other operational information to the associated gateways periodically. If the networked controller receives a temperature alert message from a reporting networked sensing device 504 indicating that the temperature at the networked sensing device 504 is higher than a pre-configured threshold (i.e., outside of prescribed limits), the networked controller enters an overheat compensation mode. In this mode, the network controller uses the influence zone table to determine all the other cooling units that affect this specific rack. The network controller then exchanges messages with the controllers associated with these cooling units to determine a supply temperature that needs to be set at the associated cooling unit in order to bring the temperature at the networked sensing device within the allowable range (i.e., within prescribed limits). The networked controller can then use the calculated supply temperature to send a set point command to the cooling unit or units that affect the particular rack. The networked controller remains in the overheat compensation mode and may periodically send the set point command to the cooling unit (CRAC/CRAH unit) until the networked controller has received an acknowledgement from the reporting networked sensing device 504. The acknowledgement can indicate that the temperature at the networked sensing device has transitioned to a temperature less than the maximum threshold (i.e., the temperature has fallen within prescribed limits). In addition to the acknowledgement from the reporting networked sensing device 504, the networked controller can also check the supply and return temperature sensors at the cooling unit to ensure that the cooling unit is responding to its control commands. Further, the networked controller can receive periodic information messages (feedback) from the reporting networked sensing device 506 identifying the changes occurring to the environmental conditions. In this manner, the networked sensing device 506 can assist the networked controller to determine the rate at which the environmental conditions are changing. If the environmental conditions are not changing fast enough (or changing too fast), the networked controller can react and adjust the set point command for the cooling unit(s) accordingly.

Similarly, if the networked controller receives a temperature alert message from a reporting networked sensing device 504 indicating that the temperature at the networked sensing device 504 is lower than a pre-configured threshold (i.e., outside of prescribed limits), the networked controller enters an undertemp compensation mode. In this mode, the network controller uses the influence zone table to determine all the other cooling units that affect this specific rack. The network controller then exchanges messages with the controllers associated with these cooling units to determine a new supply temperature that needs to be set at the associated cooling unit in order to bring the temperature at the networked sensing device within the allowable range (i.e., within prescribed limits). The networked controller can then use the calculated supply temperature to send a set point command to the cooling unit to cause the cooling unit to increase its supply temperature. This increase in supply temperature can be achieved in incremental steps. For example, after Changing the set point of the cooling unit by about 1 degrees, the networked controller can wait for an acknowledgment or information message from the reporting networked sensing device 504. The networked controller can continue to increase the set point temperature of the cooling unit until the acknowledgement or feedback from the reporting networked sensing device 504 indicates that the temperature has transitioned to within the desired range (i.e., within prescribed limits). In addition, the controller also informs the other controllers and the gateways of the action that the controller has taken.

In a particular embodiment, the behavior of a networked controller for controlling temperature can be described in detail below.

```
Configure the following parameters for CCU:
    Sa = Amount of time controller waits for an ack from devices
    smax = Maximum amount of time controller waits for ack
    Tdef = Default temperature setting for cooling unit
    CU = set of cooling units
forever do
    wait for messages from devices;
    if message = <T, Th, id> from a device then
        foreach cooling unit C in CU
            Calculate set point for C
            send set point to C
        end
        Monitor for changes in supply temperature of CU;
        if detect changes in output temperaturethen
            Wait for acknowledgement from devices;
            Acknowledgement received:
                Store status, set point;
                Continue with normal operation
        else if no changes detected within fixed amount of time
            Reset CUs to their default behavior;
        end
    end
end
```

Networked controller devices (e.g., C1, C2, C3, and C4) can use wireless pressure differential sensors 504 to ensure that the appropriate volume of cooling air/liquid is supplied to the data center. In a particular embodiment, this volume control is achieved by attaching a Variable Frequency Drive (VFD) with each cooling unit. The networked controller devices can be configured to control the speed set for the VFD's of the cooling unit. By changing the speed on the VFD's, the networked controller devices can control the volume of cooling air/liquid supplied by the cooling unit. The wireless pressure differential sensors 504 can monitor for changes in pressure with respect to a user-selectable threshold value and provide the networked controller with information indicating the pressure conditions at the location of the reporting networked sensor 504. Using this information, the networked controller can adjust the speed set for the VFD's of the cooling unit and thereby adjust the volume of cooling air/liquid supplied by the cooling unit to bring the pressure at the reporting networked sensor 504 location to within prescribed limits.

In a particular embodiment, the behavior of a pressure differential sensor can be described in detail below.

```
Configure the following parameters for the device:
    L = Location of device
    Id = Identifier of the device
    Pmin = Lower bound on press. diff. at location L
    Pmax = Upper bound on press. diff. at location L
    sn = elapsed time between sensing during normal mode
    sh = elapsed time between sensing during over pressurized mode
    mh = maximum time to wait for pressure diff. to become < Pmax
    sl= elapsed time between sensing during under pressurized mode
    ml = maximum time to wait for press. diff. to become > Pmin
mode = normal
forever do
    P = sense current pressure differential;
    if P > Pmax then // zone is over-pressurized
        mode = over-pressurized
        Send <P, Pmax, id> to all controllers in C;
        repeat
            sleep for sh seconds;
            T = sense current pressure differential;
            if P < Pmax
                mode = normal
                Send acknowledgement to CC;
            else if wait time > mh
                Send request to CC again;
                Send an alarm condition to CC
            end if
        until (mode == normal)
    else if P < Pmin then // zone is under-pressurized
        mode = under-pressurized
        Send <P, Pmin, id> to CC;
        repeat
            Sleep for sl seconds;
            T = sense current pressure differential;
            if P > Pmin
                mode = normal
                Send acknowledgement to all controllers in C;
            else if wait time > ml
                send request to CC again;
                send an alarm condition to CC;
            end if
        until (mode == normal)
    end if
    sleep for sn seconds;
end
```

Networked controller devices (e.g., C1, C2, C3, and C4) receive pressure information from the wireless pressure differential sensors 504. If the differential pressure measured at a particular reporting networked sensor 504 is less than (or greater than) a pre-configured threshold (i.e., outside of prescribed limits), the networked controller enters a pressure compensation mode. In this mode, the network controller uses the influence zone table to determine all the other cooling units that affect this specific rack. The network controller then exchanges messages with the controllers associated with these cooling units to determine a new VFD speed that needs to be set at the associated cooling unit (thereby adjusting the volume of cooling air/liquid supplied by the cooling unit) in order to bring the pressure at the networked sensing device within the allowable range (i.e., within prescribed limits). The networked controller can then use the calculated VFD speed to send a speed set command to the cooling unit to cause the cooling unit to increase or decrease the fan speed and thereby adjust the volume of cooling air/liquid supplied by the cooling unit. If the differential pressure measured at a particular reporting networked sensor 504 is less than a pre-configured threshold, the networked controller can command the cooling unit to increase the VFD speed to cause the cooling unit to increase the fan speed and thereby increase the volume of cooling air/liquid supplied by the cooling unit. The increased volume of cooling air/liquid will cause a corresponding increase in pressure at the reporting networked sensor 504. Similarly, if the differential pressure measured at a particular reporting networked sensor 504 is greater than a pre-configured threshold, the networked controller can command the cooling unit to decrease the VFD speed to cause the cooling unit to decrease the fan speed and thereby decrease the volume of cooling air/liquid supplied by the cooling unit. The decreased volume of cooling air/liquid will cause a corresponding decrease in pressure at the reporting networked sensor 504.

In a particular embodiment, the behavior of a networked controller for controlling pressure can be described in detail below.

```
Configure the following parameters for the device:
    Sa = Amount of time CC waits for an ack from devices
    smax = Maximum amount of time controller waits for ack
    Pdef = Default fan speed for cooling unit
    CU = set of cooling units
forever do
    Receive messages from devices;
    foreach cooling unit in CU
        calculate fan speed for cooling unit based on
            temperature and pressure values
        Set new fan speed for all VFDs on different controllers
        Monitor for changes in fan speed at each controller;
        if detect changes in fan speed then
            Wait for positive acknowledgement from devices;
            if (positive acknowledgement received) then
                Save status, fan speed, to gateway;
                Continue with normal operation
            else
                set fan speed again
                continue
            end if
        else if no changes detected within fixed amount of time
            Reset CU to its default status;
        end
    end
end
```

Figure 7:
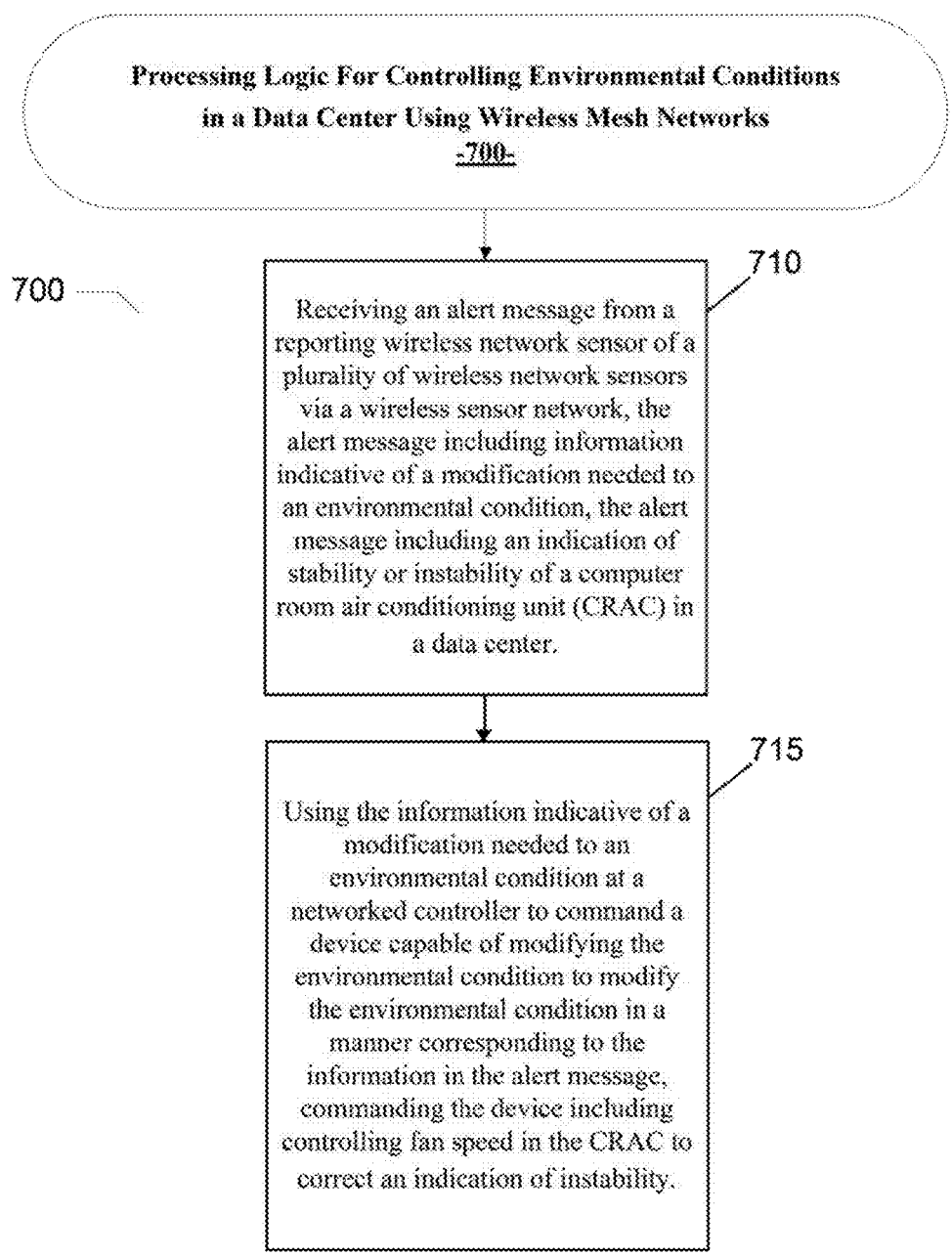
FIGS. 7 through 10 are flow diagrams illustrating the processing flow for particular example embodiments.

FIG. 7 is a flow diagram illustrating the basic processing flow 700 for a particular embodiment. As shown, an example embodiment includes: receiving an alert message from a reporting wireless network sensor of a plurality of wireless network sensors via a wireless sensor network, the alert message including information indicative of a modification needed to an environmental condition, the alert message including an indication of stability or instability of a computer room air conditioning unit (CRAC) in a data center (processing block 710); and using the information indicative of a modification needed to an environmental condition at a networked controller to command a device capable of modifying the environmental condition to modify the environmental condition in a manner corresponding to the information in the alert message, commanding the device including controlling fan speed in the CRAC to correct an indication of instability (processing block 715).

Figure 8:
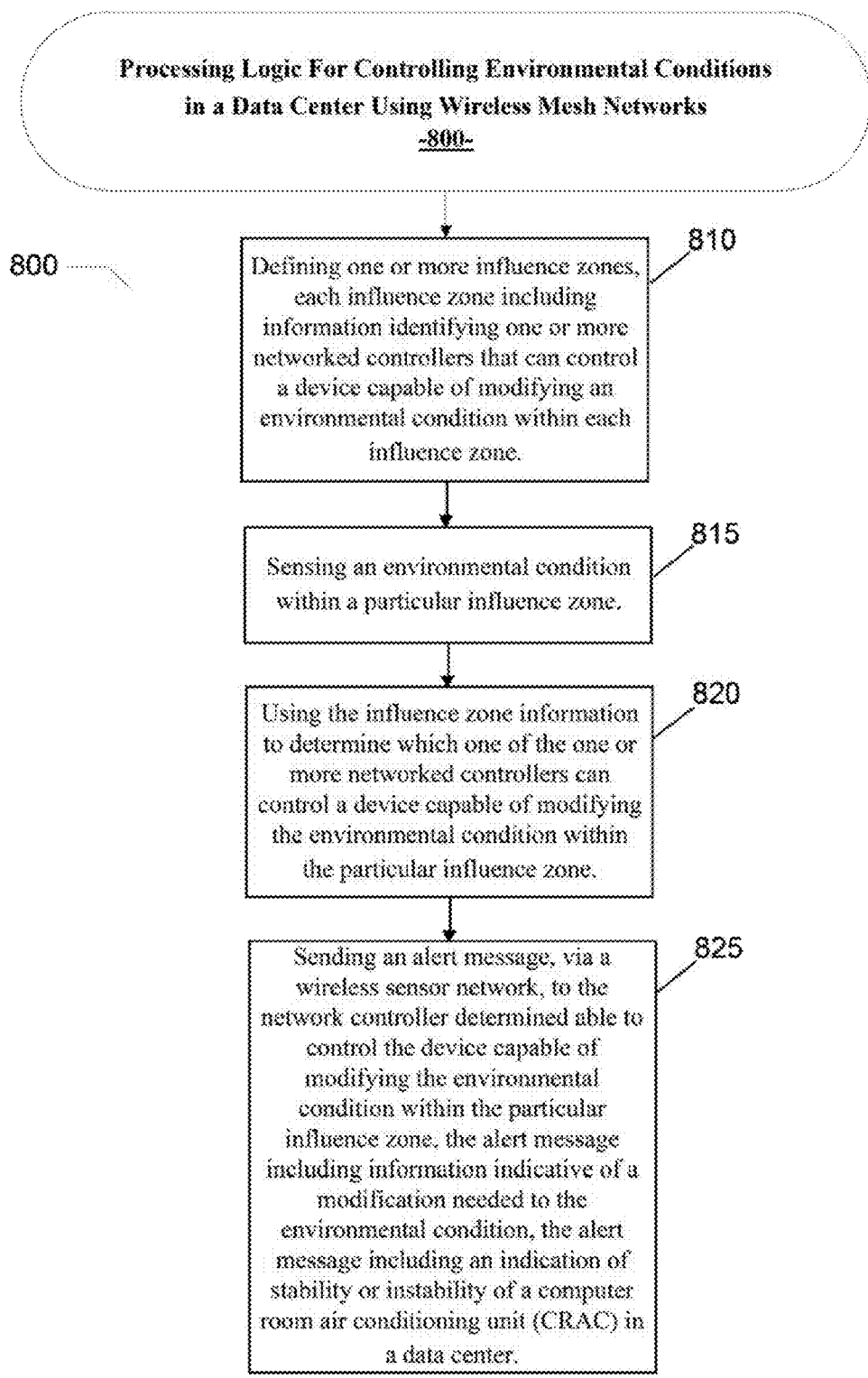

FIG. 8 is a flow diagram illustrating the basic processing flow 800 for another particular embodiment. As shown, an example embodiment includes: defining one or more influence zones, each influence zone including information identifying one or more networked controllers that can control a device capable of modifying an environmental condition within each influence zone (processing block 810); sensing an environmental condition within a particular influence zone (processing block 815); using the influence zone information to determine which one of the one or more networked controllers can control a device capable of modifying the environmental condition within the particular influence zone (processing block 820); and sending an alert message, via a wireless sensor network, to the network controller determined able to control the device capable of modifying the environmental condition within the particular influence zone, the alert message including information indicative of a modification needed to the environmental condition, the alert message including an indication of stability or instability of a computer room air conditioning unit (CRAC) in a data center (processing block 825).

Adapting for Unstable Conditions in a Cooling Unit

In addition to controlling the volume and temperature of the air, an additional constraint can be introduced in that a minimum level of airflow across the refrigeration coil of a cooling unit (e.g., CU1 or CRAC) is required in order to ensure reliable operation of the refrigeration compressor and thermal expansion bulb of the cooling unit. As described above for a particular embodiment, a Resistance Temperature Detector (RTD) can be placed near an expansion bulb of a Thermostatic Expansion Valve (TXV) of a cooling unit. This allows the ACU 510 to measure and respond to the same temperature to which the TXV responds. The RID can be placed in contact with or proximate to the evaporator of the cooling unit and insulated to achieve the most accurate readings possible from outside the refrigeration coil of the cooling unit. The RTD can be connected with or integral to a wireless sensor device, such as sensor C1 as described above, that can transmit the sensed temperature value at the TXV to the gateway 105 and then to the ACU 510. The placement of the RTD at a cooling unit and the transmission of the sensed temperature value at the TXV of the cooling unit to the ACU 510 via the wireless sensor network enable detection of a condition of insufficient airflow to maintain stable evaporator operating conditions at the cooling unit. When unstable evaporator conditions are present at the cooling unit, the airflow is increased regardless of under-floor pressure to re-stabilize the evaporator. When the evaporator is known to be on the edge of instability, fan speed reductions for environmental conditions are overridden, while increases are accepted. If changing conditions do result in instability, the fan speed is immediately raised until it is again below the threshold of instability.

Figure 9:
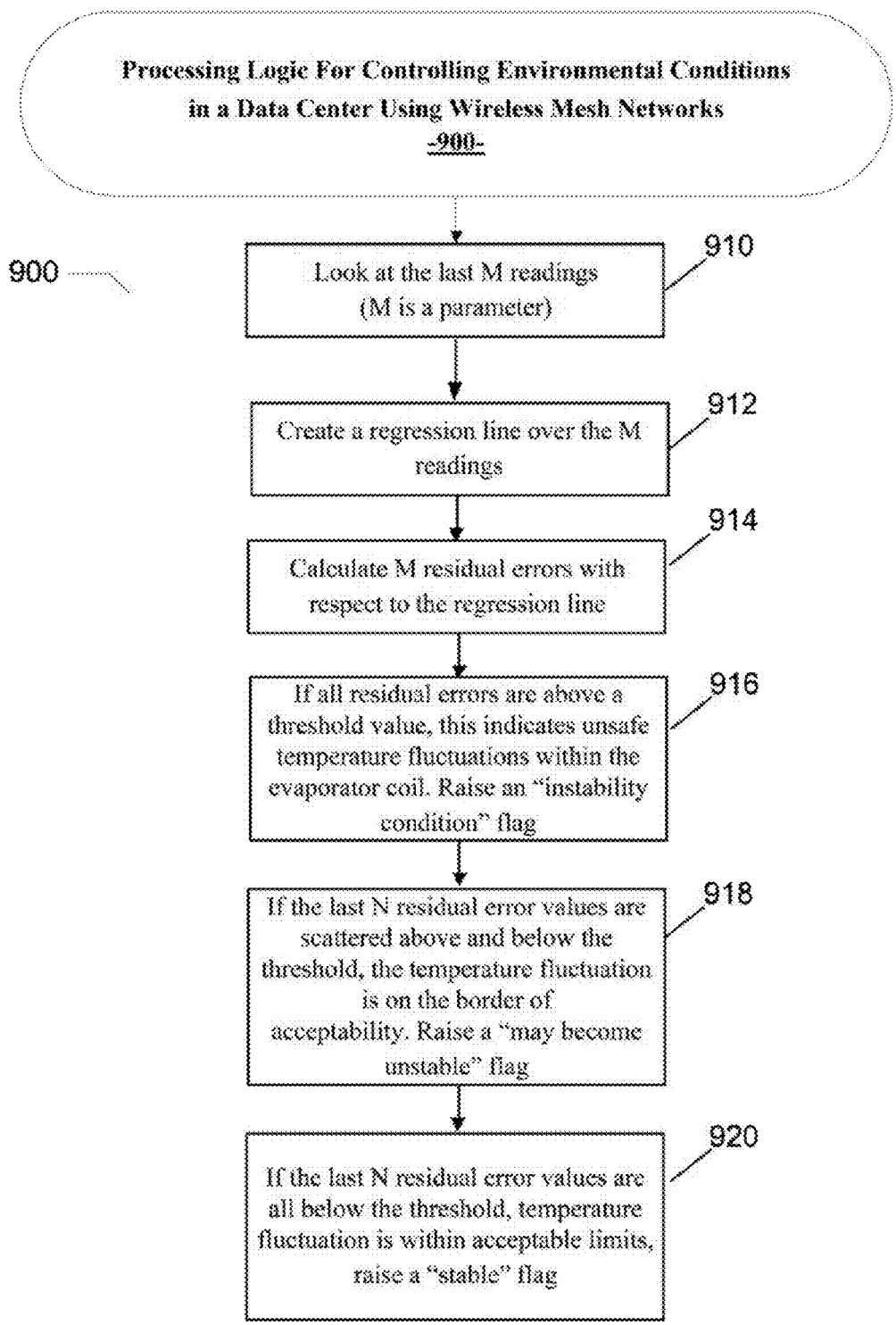
Figure 10:
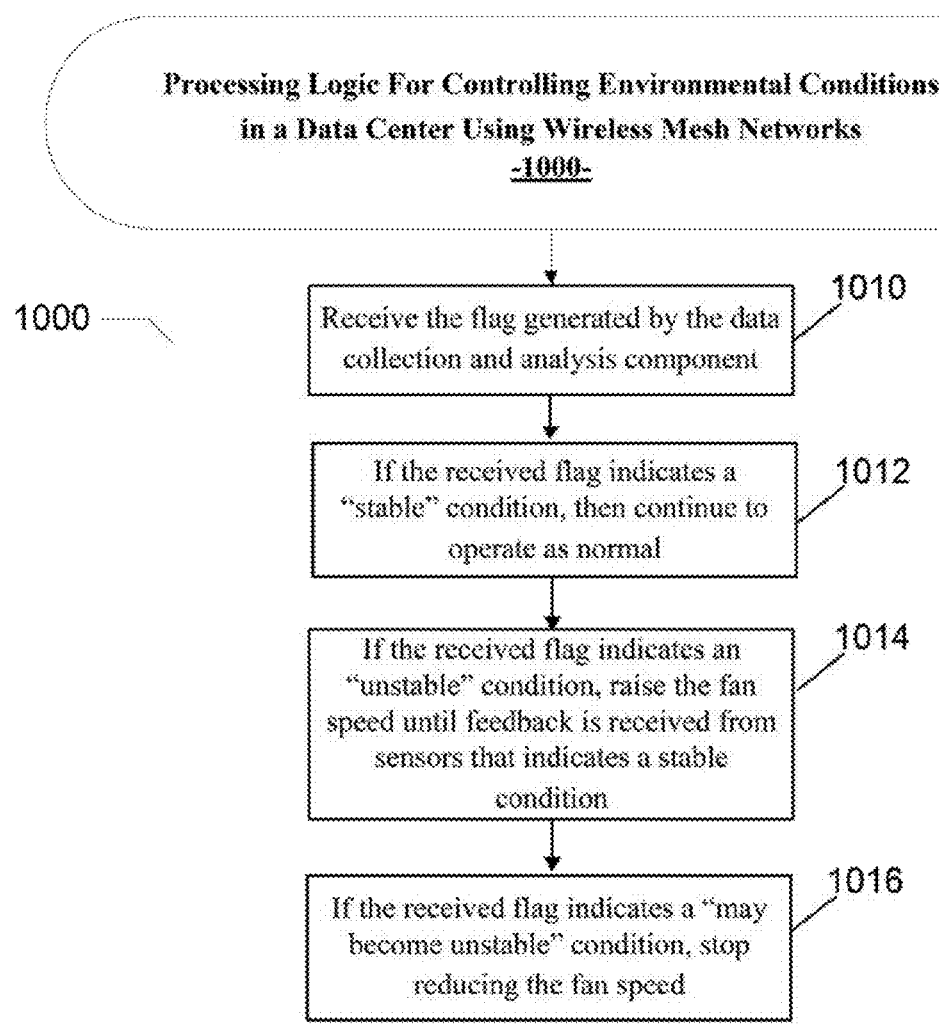

Referring now to FIGS. 9 and 10, the overall control process for managing stability conditions in a CRAC unit in an example embodiment can be divided into two components: 1] a data collection and analysis component 900 (see FIG. 9), and 2] a control component 1000 (see FIG. 10). These components are described in more detail below.

Referring now to FIG. 9, the first component 900 (data collection and analysis) involves collecting and analyzing sensor temperature data received from the various sensors via the wireless sensor network. The process in an example embodiment involves the following operations as shown in FIG. 9:

Analyze CRAC Sensor Data for Predicting Instability:
    Each temperature sensor at a CRAC takes a reading every N seconds. Every minute (or other time period), the highest and lowest temperature recorded is analyzed for instability.

Look at the last M readings [M is a parameter] (operation 910).

Create a regression line over the M readings (operation 912).

Calculate M residual errors with respect to the regression line (operation 914) and sum the residual errors.

If the last N residual errors (N is a configurable parameter) are above a threshold value, this indicates unsafe temperature fluctuations within the evaporator coil. Raise an "instability condition" flag (operation 916).

If the last N residual error values are scattered above and below the threshold, the temperature fluctuation is on the border of acceptability. Raise a "may become unstable" flag (operation 918).

If the last N residual error values are all below the threshold, temperature fluctuation is within acceptable limits, raise a "stable" flag (operation 920).

Note that this process can be performed on either the CRAC sensors or the control software. In the case of the process performed by a CRAG sensor, the CRAG sensor is responsible for maintaining the last N values as well as calculating the regression line. The CRAG sensor computes the flag conditions as described above and sends the various flags to indicate the status of the CRAC unit. An advantage of this approach is that it reduces network traffic. On the other hand, memory and CPU limitations on the sensor may put constraints on the number of past values that can be stored by the sensor.

In the case of the process performed by control software at the ACU 510, the control software can compute the flag conditions as described above by receiving sensor data every time period (e.g., each minute) from the various CRAG sensors. The control software can build the regression lines, and calculate the stability factors as described above.

Referring now to FIG. 10, the second component 1000 (control) for managing stability conditions in a CRAC unit in an example embodiment involves modifying the behavior of the control software to account for the CRAC instability. The process in an example embodiment involves the following operations as shown in FIG. 10:

Receive the flag generated by the data collection and analysis component as described above (operation 1010).

If the received flag indicates a "stable" condition, then continue to operate as normal (operation 1012).

If the received flag indicates an "unstable" condition, raise the fan speed until feedback is received from sensors that indicates a stable condition (operation 1014).

If the received flag indicates a "may become unstable" condition, stop reducing the fan speed (operation 1016).

Thus, an example embodiment as described above enables detection and control of a condition of insufficient airflow to maintain stable evaporator operating conditions at the cooling unit. When unstable evaporator conditions are present at the cooling unit, the airflow is increased regardless of under-floor pressure to re-stabilize the evaporator.

Applications that may include the apparatus and systems of various embodiments broadly include a variety of electronic and computer systems. Some embodiments implement functions in two or more specific interconnected hardware modules or devices with related control and data signals communicated between and through the modules, or as portions of an application-specific integrated circuit. Thus, the example system is applicable to software, firmware, and hardware implementations.

In example embodiments, a node configured by an application may constitute a "module" that is configured and operates to perform certain operations as described herein. In other embodiments, the "module" may be implemented mechanically or electronically. For example, a module may comprise dedicated circuitry or logic that is permanently configured (e.g., within a special-purpose processor) to perform certain operations. A module may also comprise programmable logic or circuitry (e.g., as encompassed within a general-purpose processor or other programmable processor) that is temporarily configured by software to perform certain operations. It will be appreciated that the decision to implement a module mechanically, in the dedicated and permanently configured circuitry, or in temporarily configured circuitry (e.g., configured by software) may be driven by cost and time considerations. Accordingly, the term "module" should be understood to encompass a functional entity, be that an entity that is physically constructed, permanently configured (e.g., hardwired) or temporarily configured (e.g., programmed) to operate in a certain manner and/or to perform certain operations described herein.

While the machine-readable medium 219 is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any non-transitory medium that is capable of storing, encoding or carrying a set of instructions for execution by the machine and that cause the machine to perform any one or more of the methodologies described herein. The term "machine-readable medium" shall accordingly be taken to include, but not be limited to, solid-state memories, optical media, and magnetic media.

As noted, the software and/or related data may be transmitted over a network using a transmission medium. The term "transmission medium" shall be taken to include any medium that is capable of storing, encoding or carrying instructions for transmission to and execution by the machine, and includes digital or analog communication signals or other intangible media to facilitate transmission and communication of such software and/or data.

The illustrations of embodiments described herein are intended to provide a general understanding of the structure of various embodiments, and they are not intended to serve as a complete description of all the elements and features of components and systems that might make use of the structures described herein. Many other embodiments will be apparent to those of ordinary skill in the art upon reviewing the description provided herein. Other embodiments may be utilized and derived, such that structural and logical substitutions and changes may be made without departing from the scope of this disclosure. The figures herein are merely representational and may not be drawn to scale. Certain proportions thereof may be exaggerated, while others may be minimized. Accordingly, the specification and drawings are to be regarded in an illustrative rather than a restrictive sense.

The description herein may include terms, such as "up", "down", "upper", "lower", "first", "second", etc. that are used for descriptive purposes only and are not to be construed as limiting. The elements, materials, geometries, dimensions, and sequence of operations may all be varied to suit particular applications. Parts of some embodiments may be included in, or substituted for, those of other embodiments. While the foregoing examples of dimensions and ranges are considered typical, the various embodiments are not limited to such dimensions or ranges.

The Abstract is provided to comply with 37 C.F.R. §1.74(b) to allow the reader to quickly ascertain the nature and gist of the technical disclosure. The Abstract is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments have more features than are expressly recited in each claim. Thus, the following claims are hereby incorporated into the Detailed Description, with each claim standing on its own as a separate embodiment.

Thus, as described above, an apparatus and method for controlling computer room air conditioning units (CRACs) in data centers is disclosed. Although the disclosed subject matter has been described with reference to several example embodiments, it may be understood that the words that have been used are words of description and illustration, rather than words of limitation. Changes may be made within the purview of the appended claims, as presently stated and as amended, without departing from the scope and spirit of the disclosed subject matter in all its aspects. Although the disclosed subject matter has been described with reference to particular means, materials, and embodiments, the disclosed subject matter is not intended to be limited to the particulars disclosed; rather, the subject matter extends to all functionally equivalent structures, methods, and uses such as are within the scope of the appended claims.

What is claimed is:

1. A method comprising:
receiving an alert message from a reporting wireless network sensor of a plurality of wireless network sensors via a wireless sensor network, each wireless network sensor being configured to route data to and from other wireless network sensors of the wireless sensor network, the alert message including information indicative of a modification needed to an environmental condition, the alert message including an indication of stability or instability of a computer room air conditioning unit (CRAC) in to data center, the indication of stability or instability including an indication of a level of airflow across a refrigeration coil of the CRAC as required by the CRAC to ensure reliable operation of a refrigeration compressor of the CRAC; and
using the information indicative of a modification needed to an environmental condition at a networked controller to command a device capable of modifying the environmental condition to modify the environmental condition in a manner corresponding to the information in the alert message, commanding the device including controlling fan speed in the CRAC to correct an indication of instability.

2. The method as claimed in claim 1 including receiving feedback information from the reporting wireless network sensor after the network controller has commanded the device capable of modifying the environmental condition.

3. The method as claimed in claim 1 wherein the capable of modifying the environmental condition is a CRAC.

4. The method as claimed in claim 1 wherein the environmental condition is a temperature.

5. The method as claimed in claim 1 wherein the environmental condition is a pressure.

6. The method as claimed in claim 1 including receiving the alert message from a reporting wireless network sensor via a gateway in the wireless sensor network.

7. The method as claimed in claim 1 including determining if the environmental condition is within prescribed limits.

8. A method comprising:
defining one or more influence zones, a particular influence zone of the one or more influence zones including information identifying one or more networked controllers that can control a device capable of modifying an environmental condition within the particular influence zone;
sensing an environmental condition within a particular influence zone;
using the influence zone information to determine which one of the one or more networked controllers can control a device capable of modifying the environmental condition within the particular influence zone; and
sending an alert message, via a wireless sensor network, to a network controller determined able to control the device capable of modifying the environmental condition within the particular influence zone, sending the alert message including routing data to and from other wireless network sensors of the wireless sensor network, the alert message including information indicative of a modification needed to the environmental condition, the alert message including an indication of stability or instability of a computer room air conditioning unit (CRAC) in a data center, the indication of stability or instability including an indication of a level of airflow across a refrigeration coil of the CRAC by the CRAC to ensure reliable operation of a refrigeration compressor of the CRAC.

9. The method as claimed in claim 8 including sending feedback information to the network controller determined able to control the device capable of modifying the environmental condition within the particular influence zone after the network controller has commanded the device capable of modifying the environmental condition.

10. The method as claimed in claim 8 wherein the device capable of modifying the environmental condition is a CRAC.

11. The method as claimed in claim 8, wherein the environmental condition is a temperature.

12. The method as claimed in claim 8 wherein the environmental condition is a pressure.

13. The method as claimed in claim including sending the alert message via a gateway in the wireless sensor network.

14. The method as claimed in claim 8 including determining if the environmental condition is within prescribed limits.

15. A networked sensing device comprising:
a storage component to store information related to one or more influence zones, a particular influence zone of the one or more influence zones including information identifying one or more networked controllers that can control a device capable of modifying an environmental condition within the particular influence zone;
a sensing component to sense an environmental condition within a particular influence zone, the sensing component using the influence zone information to determine which one of the one or more networked controllers can control a device capable of modifying the environmental condition within the particular influence zone; and
a network communication component to send an alert message, via a wireless sensor network, to a network controller determined able to control the device capable of modifying the environmental condition within the particular influence zone, the network communication component being configured to route data to and from other wireless network sensors of the wireless sensor network, the alert message including information indicative of a modification needed to the environmental condition, the alert message including an indication of stability or instability of a computer room air conditioning unit (CRAC) in a data center the indication of stability or instability including an indication of a level of airflow across a refrigeration coil of the CRAC as required by the CRAC to ensure reliable operation of a refrigeration compressor of the CRAC.

16. The networked sensing device as claimed in claim 15 being further configured to send feedback information to the network controller determined able to control the device capable of modifying the environmental condition within the particular influence zone after the network controller has commanded the device capable of modifying the environmental condition.

17. An article of manufacture comprising a non-transitory machine-readable storage medium having machine executable instructions embedded thereon, which when executed by a machine, cause the machine to:
   store information related to one or more influence zones, a particular influence zone of the one or more influence zones including information identifying one or more networked controllers that can control a device capable of modifying an environmental condition within the particular influence zone;
   sense an environmental condition within a particular influence zone;
   use the influence zone information to determine which one of the one or more networked controllers can control a device capable of modifying the environmental condition within the particular influence zone; and
   send an alert message, via a wireless sensor network, to a network controller determined able to control the device capable of modifying the environmental condition within the particular influence zone, sending the alert message including routing data to and from other wireless network sensors of the wireless sensor network, the alert message including information indicative of a modification needed to the environmental condition, the alert message including an indication of stability or instability of a computer room air conditioning unit (CRAC) in a data center, the indication of stability or instability including an indication of a level of airflow across a refrigeration coil of the CRAC as required by the CRAC to ensure reliable operation of a refrigeration compressor of the CRAC.

18. The article of manufacture as claimed in claim 17 being further configured to send feedback information to the network controller determined able to control the device capable of modifying the environmental condition within the particular influence zone after the network controller has commanded the device capable of modifying the environmental condition.

19. A system comprising:
   a wireless sensor network;
   one or more networked controllers in data communication via the wireless sensor network, the one or more networked controllers being configured to control a device capable of modifying an environmental condition within one or more influence zones; and
   a plurality of networked sensing devices in data communication with the one or more networked controllers via the wireless sensor network, each of the plurality of networked sensing devices being configured to route data to and from other networked sensing devices of the wireless sensor network, each of the plurality of networked sensing devices being configured to store information related to the one or more influence zones, a particular influence zone of the one or more influence zones including information identifying one or more networked controllers that can control a device capable of modifying an environmental condition within the articular influence zone, each of the plurality of networked sensing devices being further configured to sense an environmental condition within a particular influence zone and to use the influence zone information to determine which one of the one or more networked controllers can control a device capable of modifying the environmental condition within the particular influence zone, and each of the plurality of networked sensing devices being further configured to send an alert message, via the wireless sensor network, to a network controller determined able to control the device capable of modifying the environmental condition within the particular influence zone, the alert message including information indicative of a modification needed to the environmental condition, the alert message including an indication of stability or instability of a computer room air conditioning unit (MAC) in a data center, the indication of stability or instability including an indication of a level of airflow across a refrigeration coil of the CRAC as required by the CRAC to ensure reliable operation of a refrigeration compressor of the CRAC.

20. The system as claimed in claim 19 wherein each of the plurality of networked sensing devices being configured to send feedback information to the network controller determined able to control the device capable of modifying the environmental condition within the particular influence zone after the network controller has commanded the device capable of modifying the environmental condition.

* * * * *